(12) United States Patent
Gao et al.

(10) Patent No.: US 11,127,811 B2
(45) Date of Patent: Sep. 21, 2021

(54) DISPLAY PANEL WITH LAYERED TRANSMISSION PADS IN NON-DISPLAY AREA, MANUFACTURING METHOD THEREOF AND DISPLAY DEVICE

(71) Applicant: Shanghai Tianma AM-OLED Co., Ltd., Shanghai (CN)

(72) Inventors: Zhuan Gao, Shanghai (CN); Xinzhao Liu, Shanghai (CN); Kaihong Huang, Shanghai (CN); Lin Cheng, Shanghai (CN); Jiayao Yang, Shanghai (CN); Min Chen, Shanghai (CN); Yingying Wu, Shanghai (CN); Zi Xu, Shanghai (CN); Ciyi Gu, Shanghai (CN); Peng Zhang, Shanghai (CN); Jing Lv, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 129 days.

(21) Appl. No.: 16/728,031

(22) Filed: Dec. 27, 2019

(65) Prior Publication Data
US 2020/0135836 A1 Apr. 30, 2020

(30) Foreign Application Priority Data
Sep. 29, 2019 (CN) .......................... 201910937164.X

(51) Int. Cl.
*H01L 27/32* (2006.01)
*H01L 51/52* (2006.01)
(Continued)

(52) U.S. Cl.
CPC ........ *H01L 27/3276* (2013.01); *G06F 3/0412* (2013.01); *G06F 3/0443* (2019.05);
(Continued)

(58) Field of Classification Search
CPC ............. H01L 27/3276; H01L 27/3246; H01L 51/5246; H01L 51/525; H01L 51/5253;
(Continued)

(56) References Cited

U.S. PATENT DOCUMENTS

| 2011/0291119 A1* | 12/2011 | Ryu ...................... H01L 51/524 257/88 |
| 2012/0025700 A1* | 2/2012 | Ryu .................... H01L 27/3276 313/512 |

(Continued)

FOREIGN PATENT DOCUMENTS

CN 103293736 A 9/2013

*Primary Examiner* — Lex H Malsawma
(74) *Attorney, Agent, or Firm* — Kilpatrick Townsend & Stockton

(57) ABSTRACT

The present disclosure discloses a display panel, a manufacturing method thereof and a display device. By arranging positions of first transmission pads and second transmission pads, and setting areas of first film layers in the first transmission pads to be less than those of second film layers, when the first transmission pads and the second transmission pads are disposed oppositely, fully-opened openings are formed between the two pads, so that it is convenient to fill spaces between the first transmission pads and the second transmission pads with conductive components to allow the first transmission pads be electrically connected with the second transmission pads through the conductive components, guaranteeing an effective electrical connection between the first transmission pads and the second transmission pads and then ensuring signal transmission via first wires and second wires through the first transmission pads and the second transmission pads.

20 Claims, 9 Drawing Sheets

(51) Int. Cl.
*G06F 3/041* (2006.01)
*G06F 3/044* (2006.01)

(52) U.S. Cl.
CPC ........ *H01L 27/3246* (2013.01); *H01L 51/525* (2013.01); *H01L 51/5246* (2013.01); *H01L 51/5253* (2013.01); *H01L 2227/323* (2013.01)

(58) Field of Classification Search
CPC . H01L 2227/323; G06F 3/0443; G06F 3/0412
See application file for complete search history.

(56) References Cited

U.S. PATENT DOCUMENTS

| | | | | |
|---|---|---|---|---|
| 2012/0026074 A1* | 2/2012 | Lee | ..................... | H01L 51/5237 345/76 |
| 2012/0091484 A1* | 4/2012 | Lee | ..................... | H01L 51/5246 257/91 |
| 2012/0097987 A1* | 4/2012 | Ryu | ...................... | H01L 51/524 257/88 |
| 2012/0104420 A1* | 5/2012 | Lee | ...................... | H01L 51/524 257/88 |
| 2012/0126258 A1* | 5/2012 | Lee | ..................... | H01L 27/3276 257/88 |
| 2012/0146487 A1* | 6/2012 | Kim | ..................... | H01L 51/5259 313/504 |
| 2012/0146493 A1* | 6/2012 | Ra | ..................... | H01L 51/5243 313/512 |
| 2012/0153814 A1* | 6/2012 | Lee | ..................... | H01L 27/3276 313/504 |
| 2012/0168779 A1* | 7/2012 | Lee | ..................... | H01L 51/5243 257/88 |
| 2015/0236292 A1* | 8/2015 | Sato | ..................... | H01L 51/5203 257/40 |
| 2015/0287771 A1* | 10/2015 | Lee | ..................... | H01L 27/3276 257/40 |

* cited by examiner

US 11,127,811 B2

DISPLAY PANEL WITH LAYERED TRANSMISSION PADS IN NON-DISPLAY AREA, MANUFACTURING METHOD THEREOF AND DISPLAY DEVICE

CROSS REFERENCE TO RELATED APPLICATION

This application claims priority to Chinese Patent Application No. 201910937164.X, filed with the Chinese Patent Office on Sep. 29, 2019. The entire disclosure of the above application is incorporated herein by reference.

FIELD

The present disclosure relates to the field of display, and particularly relates to a display panel, a manufacturing method thereof and a display device.

BACKGROUND

An electroluminescent display panel with a touch function may generally include: a touch substrate and an array substrate disposed oppositely. Touch electrodes and touch signal lines electrically connected to the touch electrodes are formed on the touch substrate. Pixels, data lines and a driver chip are manufactured on a side, facing the touch substrate, of the array substrate. The data lines are electrically connected to the driver chip and the pixels, respectively, and are configured to transmit data signals provided by the driver chip to the corresponding pixels to realize a display function.

When the touch substrate and the array substrate share one driver chip, and the driver chip is disposed on the array substrate, a touch signal from the touch substrate needs to be introduced to the driver chip in the array substrate to facilitate the realization of the touch function.

Thus, how to introduce the touch signal from the touch substrate to the driver chip in the array substrate to be solved urgently.

SUMMARY

Embodiments of the present disclosure provide a display panel, a manufacturing method thereof and a display device to allow a touch signal from a touch substrate be transmitted to a driver chip in an array substrate to realize a touch function.

In one embodiment of the present disclosure provides a display panel. The display panel includes a display area and a non-display area surrounding the display area. The display panel further includes: a first substrate and a second substrate, disposed oppositely; a sealant, disposed between the first substrate and the second substrate and located in the non-display area; first transmission pads and first wires, disposed on a side, facing the second substrate, of the first substrate, where the first transmission pads are correspondingly electrically connected with the first wires; second transmission pads and second wires, disposed on a side of the second substrate facing the first substrate, wherein the second transmission pads are correspondingly electrically connected with the second wires, the first transmission pads and the second transmission pads are both located at a side of the sealant away from the display area, and orthographic projections of the first transmission pads and the second transmission pads on the first substrate have an overlapping field; and conductive components, disposed between the first transmission pads and the second transmission pads and electrically connected to the first transmission pads and the second transmission pads, respectively, where the first transmission pads comprise a plurality of film layers, in a same first transmission pads, a first film layer is a film layer farthest from a surface of the first substrate, a second film layer is a film layer closest to the surface of the first substrate, and an area of the first film layer is less than that of the second film layer.

In one embodiment of the present disclosure provides a display device. The display device includes the aforementioned display panel provided by the embodiment of the present disclosure.

In one embodiment of the present disclosure provides a manufacturing method of a display panel. The method includes: manufacturing first wires, first transmission pads and a sealant respectively on a side surface of a first substrate, where the first transmission pads are electrically connected with the first wires; manufacturing second wires and second transmission pads respectively on a side surface of a second substrate, where the second transmission pads are electrically connected with the second wires; placing the side surface, provided with the first transmission pads, of the first substrate and the side surface, provided with the second transmission pads, of the second substrate oppositely, and applying the sealant to encapsulate the first substrate and the second substrate through the sealant; filling spaces between the first transmission pads and the second transmission pads with conductive components to electrically connect the first transmission pads to the second transmission pads through the conductive components; where the display panel includes a display area and a non-display area surrounding the display area; the sealant, the first transmission pads and the second transmission pads are all located in the non-display area; the first transmission pads and the second transmission pads are both located at the side, away from the display area, of the sealant; orthographic projections of the first transmission pads and the second transmission pads on the first substrate have an overlapping field; and the first transmission pads include the plurality of film layers, in the same first transmission pad, the film layer farthest from the surface of the first substrate is a first film layer, the film layer closest to the surface of the first substrate is a second film layer, and the area of the first film layer is less than that of the second film layer.

The present disclosure has the beneficial effects as follows.

According to the display panel, the manufacturing method thereof and the display device provided by the embodiments of the present disclosure, by arranging the first transmission pads and the second transmission pads on the side, away from the display area, of the sealant and setting the areas of the first film layers in the first transmission pads to be less than those of the second film layers, when the first transmission pads and the second transmission pads are disposed oppositely, fully-opened openings are formed between the two pads, so that it is convenient to fill the spaces between the first transmission pads and the second transmission pads with the conductive components, and the first transmission pads are electrically connected with the second transmission pads through the conductive components, guaranteeing an effective electrical connection between the first transmission pads and the second transmission pads and then ensuring the signal transmission via the first wires and the second wires through the first transmission pads and the second transmission pads.

Furthermore, in the embodiments of the present disclosure, the effective electrical connection between the first transmission pads and the second transmission pads may be realized without adding new film layers on the first substrate or thickening the existing film layers. In this way, not only can the manufacturing difficulty of the display panel be lowered, but also the manufacturing cost of the display panel can be reduced, lowering the manufacturing difficulty and reducing the manufacturing cost of the display device.

Where:

A: display area; B: non-display area; 11: first substrate; 12, 121 and 122: first transmission pad; 12a: first film layer;

12b: first middle film layer; 12c: second film layer; 13: first wire;

14: driver chip; 15: pixel defining structure; 16: first film layer structure;

17: spacer; 21: second substrate; 22: second transmission pad;

22a: third film layer; 22b: second middle film layer; 22b1: first insulating layer;

22b2: second conductive layer; 22b3: second insulating layer;

22c: fourth film layer; 23: second wire; 30: sealant;

31: encapsulating metal layer; 40: conductive component;

41: conductive spherical particle; 50: spacing component;

51: first spacing structure; 52: second spacing structure;

60: encapsulating adhesive; 100: display panel.

DETAILED DESCRIPTION OF THE EMBODIMENTS

One embodiment of a display panel, a manufacturing method thereof and a display device which are provided by the embodiments of the present disclosure will be described in detail below in conjunction with accompanying drawings. It should be noted that the described embodiments are merely a part of the embodiments of the present disclosure, not all the embodiments.

Inventors have found in researches that when a touch substrate and an array substrate share one driver chip and the driver chip is disposed on the array substrate, in order to transmit a touch signal to the driver chip, transmission pads may be respectively manufactured on the touch substrate and the array substrate to allow the touch signal from the touch substrate be transmitted to the driver chip on the array substrate through an electrical connection of the transmission pads on the two substrates.

Generally, the transmission pads are disposed on a side, close to a display area, of a sealant. If pixel defining structures and spacers are disposed in the display area and no pixel defining structures and spacers exist on positions of the transmission pads, a height difference between the display area and an area where the transmission pads are located will be generated on the array substrate. That is, the thickness of the area where the transmission pads are located is less than that of the display area, which causes no contact between the transmission pads on the two substrates, namely the electrical connection may not be realized, and the transmission of the touch signal is finally affected.

Based on this, some embodiments of the present disclosure provide a display panel, to enhance the effective electrical connection of the transmission pads on the two substrates and guarantee the effective transmission of the touch signal.

Figure 1:
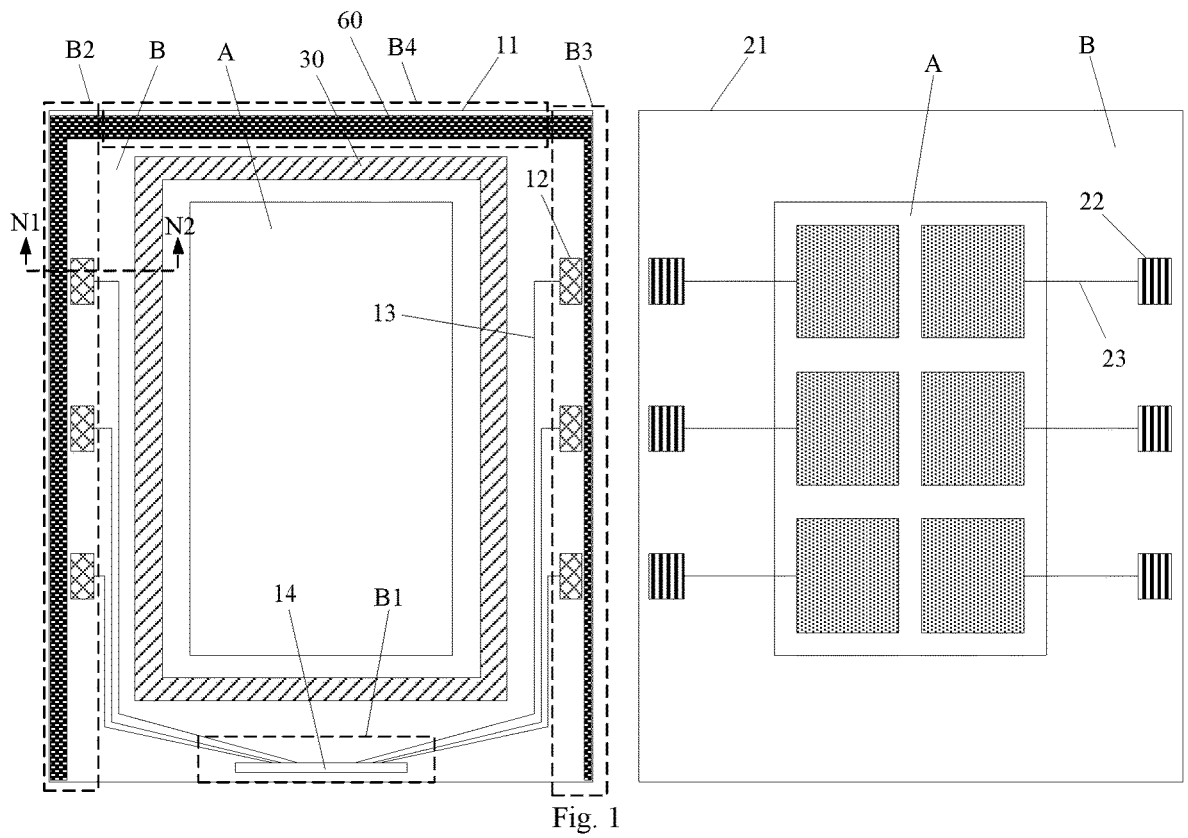
FIG. 1 is a schematic structural diagram of a display panel provided in some embodiments of the present disclosure.
Figure 2:
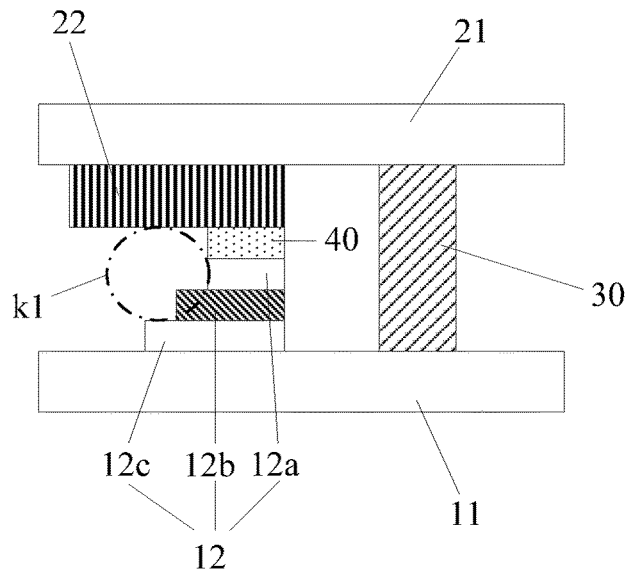
FIG. 2 is a cross-sectional view taken along the line N1-N2 indicated in FIG. 1.
Figure 3:
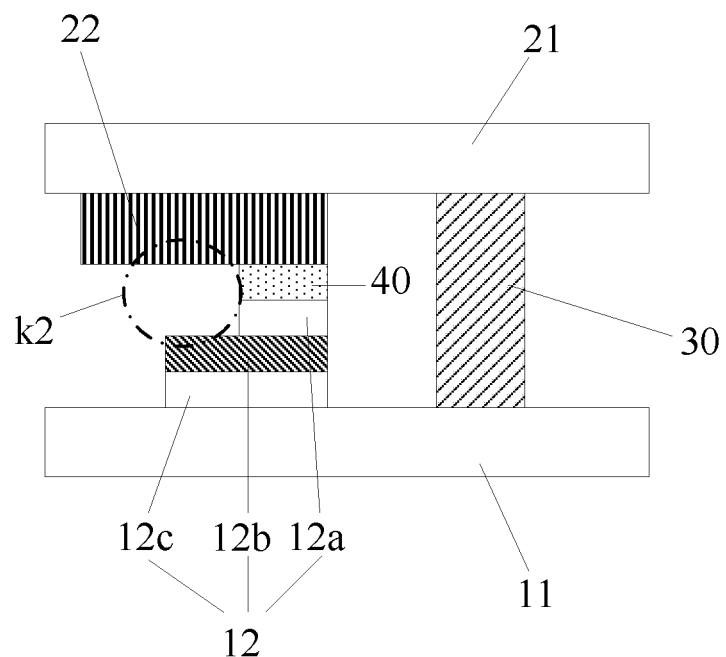
FIG. 3 is another cross-sectional view taken along the line N1-N2 indicated in FIG. 1.

In some embodiments of the present disclosure, a display panel is provided as shown in FIG. 1 to FIG. 3. FIG. 1 is a schematic structural diagram of the display panel. In order to facilitate describing structures of a first substrate and a second substrate, structural arrangement on the first substrate and the second substrate are illustrated separately, FIG. 2 is a cross-sectional view taken along the line N1-N2 indicated in FIG. 1, and FIG. 3 is another cross-sectional view taken along the line N1-N2 indicated in FIG. 1.

Referring to FIG. 1 to FIG. 3, in some embodiments of the disclosure, the display panel includes a display area A and a non-display area B surrounding the display area A. The display panel further includes:

a first substrate 11 and a second substrate 21, disposed oppositely, as shown in FIG. 2 and FIG. 3;

a sealant 30, disposed between the first substrate 11 and the second substrate 21 and located in the non-display area B, as shown in FIG. 2 and FIG. 3;

first transmission pads 12 and first wires 13, located on a side, facing the second substrate 21, of the first substrate 11, where the first transmission pads 12 are correspondingly electrically connected with the first wires 13, as shown in FIG. 1;

second transmission pads 22 and second wires 23, located on a side, facing the first substrate 11, of the second substrate 21, where the second transmission pads 22 are correspondingly electrically connected with the second wires 23, and the first transmission pads 12 and the second transmission pads 22 are both located on a side, away from the display area A, of the sealant 30, as shown in FIG. 1;

orthographic projections of each first transmission pad 12 and the corresponding second transmission pad 22 on the first substrate 11 have an overlapping field, as shown in FIG. 2 and FIG. 3; and conductive components 40, disposed between the first transmission pads 12 and the second transmission pads 22 and electrically connected to the first transmission pads 12 and the second transmission pads 22, as shown in FIG. 2 and FIG. 3.

The first transmission pads 12 include film layers, in the same first transmission pad 12: the film layer farthest from the surface of the first substrate 11 is a first film layer 12a, the film layer closest to the surface of the first substrate 11 is a second film layer 12c, and the area of the first film layer 12a is less than that of the second film layer 12c.

In some embodiments of the present disclosure, by arranging each first transmission pad 12 and each second transmission pad 22 on the side, away from the display area A, of the sealant 30 and setting the area of the first film layer 12a in the first transmission pad 12 to be less than that of the second film layer 12c, when the first transmission pad 12 and the second transmission pad 22 are disposed oppositely, a fully-opened opening (shown by a dotted line circle K1 in FIG. 2 and shown by a dotted line circle K2 in FIG. 3) is formed between the two pads, so that it is convenient to fill a space between the first transmission pad 12 and the second transmission pad 22 with each conductive component 40, and thus the first transmission pad 12 is electrically connected with the second transmission pad 22 through the conductive component 40, as shown in FIG. 2 and FIG. 3, guaranteeing the effective electrical connection between the first transmission pad 12 and the second transmission pad 22 and then ensuring that a signal can be transmitted via the first wire 13 and the second wire 23 with the help of the first transmission pad 12 and the second transmission pad 22.

Furthermore, in the embodiments of the present disclosure, the effective electrical connection between the first transmission pads 12 and the second transmission pads 22 may be realized without adding new film layers on the first substrate 11 and thickening the existing film layers. In this way, not only can the manufacturing difficulty of the display panel be lowered, but also the manufacturing cost of the display panel can be reduced, lowering the manufacturing difficulty and reducing the manufacturing cost of the display device.

In some embodiments of the present disclosure, the various first transmission pads (and the various second transmission pads) may be all located on the same side (not illustrated) of the display area. Of course, the various first transmission pads 12 (and the various second transmission pads 22) may also be located on sides of the display area A, as shown in FIG. 1. In this way, the various first transmission pads 12 (and the various second transmission pads 22) are distributed more dispersive to reduce the occurrence probability of short circuit between the first transmission pads 12, improving the reliability of the display panel.

Correspondingly, in order to guarantee the electrical connection between the first transmission pads 12 and the second transmission pads 22, the second transmission pads 22 are disposed on positions of the second substrate corresponding to positions of the first substrate where the first transmission pads 12 are disposed, so that the first transmission pads 12 and the second transmission pads 22 are correspondingly disposed, and the orthographic projections of each first transmission pad 12 and the corresponding second transmission pad 22 on the first substrate have an overlapping field.

In some embodiments of the present disclosure, since gaps exist between the first transmission pads and the second transmission pads, the conductive components need to be disposed in the gaps between the first transmission pads and the second transmission pads to realize the electrical connection between the first transmission pads and the second transmission pads.

In some embodiments of the present disclosure, the conductive components may be conductive adhesives. In this circumstance, the conductive adhesives may include conductive spherical particles, where the diameters of the conductive spherical particles may be less than or equal to the minimum distance from the first transmission pads to the second transmission pads.

Figure 4:
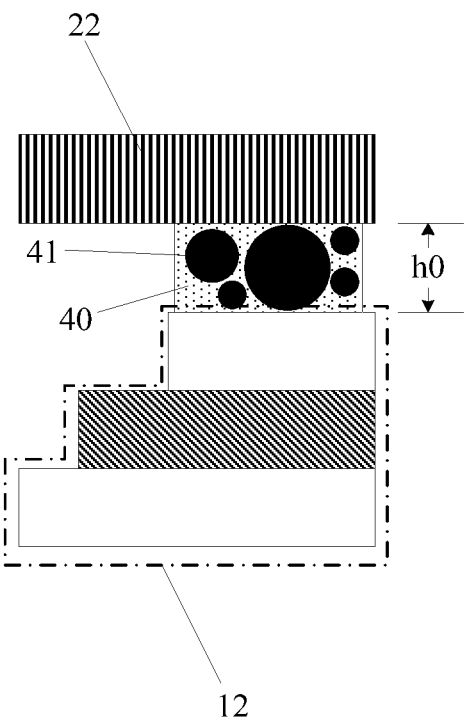
FIG. 4 is a schematic structural diagram of a conductive component provided in some embodiments of the present disclosure.

In one embodiment, as shown in the schematic structural diagram of the conductive component in FIG. 4, the minimum distance from the first transmission pad 12 to the second transmission pad 22 is denoted by h0, and the conductive spherical particles in the conductive adhesives are denoted by 41, where the conductive adhesive includes conductive spherical particles 41, at least part of which have different diameters, for example, the diameters of some conductive spherical particles 41 may be equal to h0, and the diameters of some conductive spherical particles 41 may be less than h0.

Figure 5:
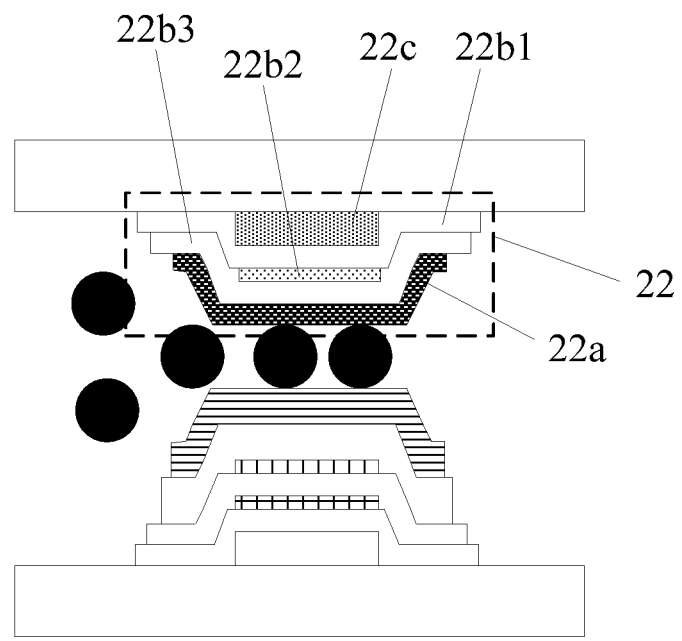
FIG. 5 is a schematic diagram of film layer structures of a first transmission pad and a second transmission pad provided in some embodiment of the present disclosure.

In some embodiments, when the conductive adhesive includes the conductive spherical particles, the diameter of each conductive spherical particle may also be set to be equal (as shown in the schematic diagram of specific film layer structures of the first transmission pad 12 and the second transmission pad 22 in FIG. 5), and at this time, the diameter of each conductive spherical particle may be h0.

That is, the diameters of the conductive spherical particles are not limited herein, as long as the electrical connection between the first transmission pads and the second transmission pads may be realized through the conductive spherical particles in the conductive adhesives. The diameters may be set according to an actual need to improve the design flexibility.

Furthermore, the first substrate and the second substrate are disposed oppositely in an actual manufacturing process, so that the conductive components are manufactured after the first transmission pads and the second transmission pads are disposed oppositely.

Therefore, in the embodiments of the present disclosure, by setting the conductive components as the conductive adhesives and combining the arrangement of the film layers in the first transmission pads, when the fully-opened openings are formed between the first transmission pads and the second transmission pads, the conductive adhesives may be conveniently squeezed into the gaps between the first transmission pads and the second transmission pads, lowering the manufacturing difficulty of the conductive components and the manufacturing difficulty of the display panel and improving the manufacturing efficiency of the display panel.

In some embodiments of the present disclosure, the diameters of the conductive spherical particles is set to be 2.5 μm to 3.5 μm, so that the conductive spherical particles may more conveniently get into the gaps between the first transmission pads and the second transmission pads to realize the electrical connection between the first transmission pads and the second transmission pads.

It is noted that, in some embodiments, the diameters of the conductive spherical particles may be determined according to the film layer structures included in the second transmission pads.

In one embodiment, a first conductive layer, an insulating layer and a second conductive layer are disposed on the second substrate in sequence. When the second substrate is a substrate in a touch substrate, the second transmission pad also includes: the first conductive layer (i.e., a fourth film layer described below), the insulating layer and the second conductive layer (i.e., a third film layer described below) which are not shown in the figure, where in regions except the region where the second transmission pad is located, the first conductive layer includes second wires (i.e., touch signal lines), and the second conductive layer includes touch electrodes, namely the plurality of touch electrodes are disposed on the same layer. Accordingly, a touch detection principle may be a self-capacitance touch detection principle, and the touch electrodes may be self-capacitance electrodes.

At this time, the second transmission pad 22 includes a relatively small number of film layers, so that the gap between the second transmission pad 22 and the first transmission pad 12 is relatively large. It can be understood that the value of h0 in FIG. 4 is relatively large. Therefore, the diameters of the conductive spherical particles 41 may be set to be larger such as 3 μm to 3.5 μm.

For another example, a first conductive layer, a first insulating layer, a second conductive layer, a second insulating layer and a third conductive layer are disposed on the second substrate in sequence. When the second substrate is a substrate in a touch substrate, as shown in FIG. 5, the second transmission pad also includes: the first conductive layer (i.e., a fourth film layer described below), the first insulating layer, the second conductive layer, the second insulating layer and the third conductive layer (i.e., a third film layer described below), where in regions except the region where the second transmission pad 22 is located, the first conductive layer includes second wires (i.e., touch signal lines), the second conductive layer includes first touch electrodes, the third conductive layer includes second touch electrodes, orthographic projections of the first touch electrodes and the second touch electrodes on the second substrate have an overlapping field. Accordingly, a touch detection principle may be a mutual-capacitance touch detection principle, and the first touch electrodes and the second touch electrodes may be mutual-capacitance electrodes.

At this time, the second transmission pad 22 includes a relatively large number of film layers, so that the gap between the second transmission pad 22 and the first transmission pad 12 is slightly smaller than the gap in the above example. It can be understood that the value of h0 in FIG. 4 is relatively small. Therefore, the diameters of the conductive spherical particles 41 may be set to be smaller such as 2.5 μm to 3 μm.

Of course, the diameters of the conductive spherical particles may also be set to be less than 2.5 μm, namely the diameters of the conductive spherical particles are set to be smaller, but they are not limited herein, as long as the electrical connection between the first transmission pad and the second transmission pad may be realized.

In some embodiments of the present disclosure, the conductive spherical particles may be conductive gold ball particles. Of course, the conductive spherical particles may also be other conductive metal particles, but are not limited herein.

In some embodiments of the present disclosure, the plurality of film layers included in the same first transmission pad may be set below:

the areas of at least parts of the film layers are set to be different.

In some embodiments, the areas of the first film layer and the second film layer are set to be different, and the areas of other film layers are all set to be equal to the area of the first film layer, not illustrated in the figure; or, the areas of other film layers are all set to be equal to the area of the second film layer.

In one embodiment, FIG. 3 illustrating three film layers is taken as an example. The first film layer is denoted by 12a, the second film layer is denoted by 12c, a first middle film layer is denoted by 12b, and the first middle film layer 12b and the second film layer 12c are the same in area which is greater than that of the first film layer 12a.

In this way, the manufacturing difficulty of the first transmission pads may be lowered, and the manufacturing process of the display panel may be simplified, improving the manufacturing efficiency of the display panel.

In some embodiments, the areas of the various film layers may be all set to be different. In one embodiment, in the embodiments of the present disclosure, the area of each film layer of the same first transmission pad is in negative correlation with a distance from the film layer to the surface of the first substrate.

That is, for each film layer of the same first transmission pad: if the film layer is farther from the surface of the first substrate, the area of the film layer is smaller; correspondingly, if the film layer is closer to the surface of the first substrate, the area of the film layer is larger.

In one embodiment, FIG. 2 illustrating three film layers is taken as an example. The first film layer is denoted by 12a, the second film layer is denoted by 12c, and a first middle film layer is denoted by 12b, where the order of the three film layers arranged from far to near according to the distances from the three film layers to the surface of the first substrate 11 is: the first film layer 12a, the first middle film layer 12b and the second film layer 12c, and correspondingly, the order of the three film layers arranged according to the areas from small to large is: the first film layer 12a, the first middle film layer 12b and the second film layer 12c.

In this way, the edges of the various film layers at a same side in the same first transmission pad 12 are in a step-like climbing design, as shown in FIG. 2. When the conductive component 40 is the conductive adhesive, the conductive adhesive may be conveniently squeezed into the gap between the first transmission pad 12 and the second transmission pad 22, so that the manufacturing difficulty of the display panel is lowered in addition to realizing the effective electrical connection between the first transmission pad 12 and the second transmission pad 22.

In some embodiments, besides the areas of part of all of the film layers in the first transmission pad being set differently, the areas of the film layers in the second transmission pad may also be set differently, so that the opening formed by the first transmission pad and the second transmission pad is further expanded.

Therefore, when the second transmission pad includes film layers, for the film layers included in the same second transmission pad: the film layer farthest from the second substrate is the third film layer, the film layer closest to the second substrate is the fourth film layer, and the area of the third film layer is less than that of the fourth film layer.

Orthographic projections of the third film layer and the first film layer on the first substrate have an overlapping field.

That is, in the embodiments of the present disclosure, the plurality of film layers included in the same second transmission pad may also be set as below:

the areas of at least parts of the film layers are set to be different.

In the embodiment of the present disclosure, the areas of parts of the film layers in the same second transmission pad are set to be different.

In one embodiment, the areas of the third film layer and the fourth film layer may be set to be different, and the areas of other film layers are all set to be equal to the area of the third film layer, not illustrated in the figure; or, the areas of other film layers are all set to be equal to the area of the fourth film layer, not illustrated in the figure.

In this way, the manufacturing difficulty of the second transmission pads may be lowered, and the manufacturing process of the display panel may be simplified, improving the manufacturing efficiency of the display panel.

In the embodiment of the present disclosure, the areas of the various film layers of the same second transmission pad are all set to be different. In one embodiment, the area of each film layer of the same second transmission pad is in negative correlation with the distance from the film layer to the surface of the second substrate.

That is, for each film layer of the same second transmission pad: if the film layer is farther from the surface of the second substrate, the area of the film layer is smaller; correspondingly, if the film layer is closer to the surface of the second substrate, the area of the film layer is larger.

Figure 6:
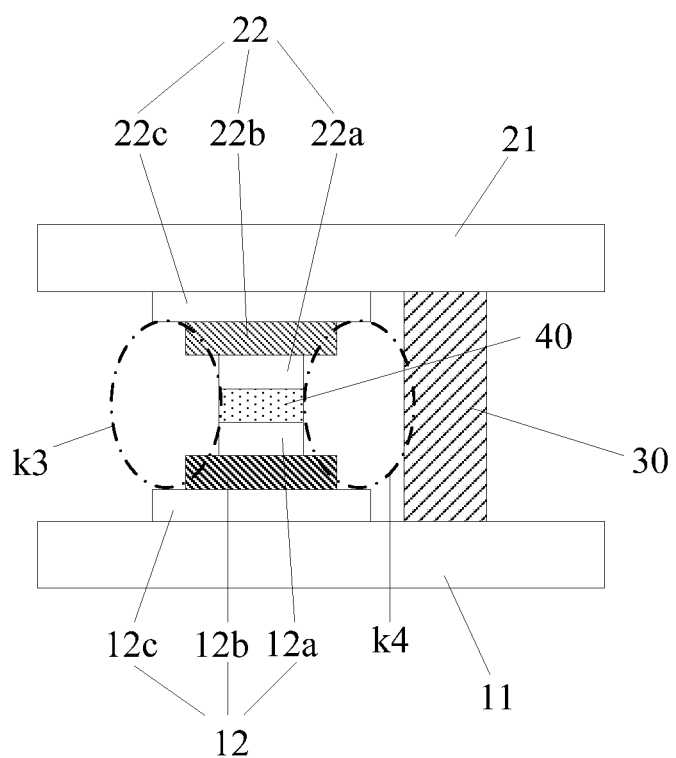
FIG. 6 is a further cross-sectional view taken along the line N1-N2 indicated in FIG. 1.

In one embodiment, FIG. 6 illustrating a cross-sectional view taken along the line N1-N2 indicated in FIG. 1 is taken as an example. The second transmission pad 22 includes three film layers. The third film layer is denoted by 22a, the fourth film layer is denoted by 22c, and a second middle film layer is denoted by 22b, where the order of the three film layers arranged from far to near according to the distances from the three film layers to the surface of the second substrate 21 is: the third film layer 22a, the second middle film layer 22b and the fourth film layer 22c, and correspondingly, the order of the three film layers arranged according to the areas from small to large is: the third film layer 22a, the second middle film layer 22b and the fourth film layer 22c.

In this way, the edges of the various film layers at a same side in the same first transmission pad 22 are in a step-like climbing design, and the edges of the various film layers at a same side in the same first transmission pad 12 are in the step-like climbing design, as shown in FIG. 6. When the conductive component 40 is the conductive adhesive, the conductive adhesive may be conveniently squeezed into the gap between the first transmission pad 12 and the second transmission pad 22, so that the manufacturing difficulty of the display panel is lowered in addition to realizing the effective electrical connection between the first transmission pad 12 and the second transmission pad 22.

In some embodiments of the present disclosure, the orthographic projections of the first transmission pad 12 and the second transmission pad 22 on the first substrate coincide, as shown in FIG. 6.

In this way, not only is the effective electrical connection between the first transmission pad 12 and the second transmission pad 22 through the conductive component 40 facilitated, but also the area occupied by the first transmission pad 12 and the second transmission pad 22 in the non-display area may be reduced, facilitating the design of a high screen-to-body ratio and a narrow bezel.

In some embodiments of the present disclosure, orthographic projections of the first film layer 12a and the third film layer 22a on the first substrate 11 overlap partially, not illustrated in the figure, which can be set according to an actual situation, improving the design flexibility.

In some embodiments, the orthographic projections of the first film layer 12a and the third film layer 22a on the first substrate 11 coincide, that is, the first film layers 12a and the third film layers 22a are equal in area and disposed oppositely, as shown in FIG. 6, to ensure that the conductive component 40 is in full contact with the first film layers 12a and the third film layers 22a when being the conductive adhesive, to guarantee the effective electrical connection.

Further, in some embodiments of the present disclosure, the areas of the first film layer and the third film layer may be both set to be $10^4$ μm$^2$ to $4 \times 10^4$ μm$^2$.

In this way, the deficiency that the first film layer and the third film layer may not be effectively electrically connected with the conductive component 40 due to the too small areas (less than $10^4$ μm$^2$); furthermore, if the first film layer and the third film layer have too large areas such as greater than $4 \times 10^4$ μm$^2$, since the area of the second film layer is greater than that of the first film layer, and the area of the fourth film layer is greater than that of the third film layer, the problem of relatively large volumes of the first transmission pad and the second transmission pad may occur.

Therefore, setting the areas of the first film layer and the third film layer to be within the above range may guarantee the effective electrical connection among the first transmission pad, the second transmission pad and the conductive component and may also be favorable for reducing the volumes of the first transmission pad and the second transmission pad and then reducing the area occupied by the first transmission pad and the second transmission pad on the non-display area, facilitating the realization of the design of the high screen-to-body ratio and the narrow bezel.

Figure 7:
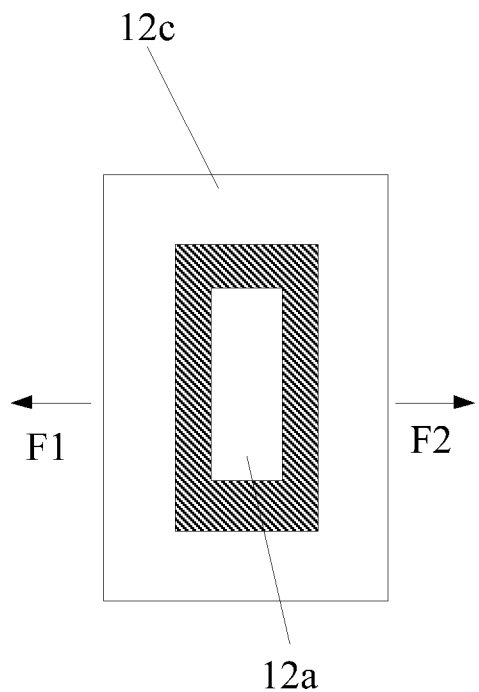
FIG. 7 is a schematic diagram of relative positions of various film layers in the first transmission pad corresponding to FIG. 6.

In some embodiments of the present disclosure, the first transmission pad is taken as an example. When the area of the first film layer is less than that of the second film layer, an orthographic projection of the first film layer on the first substrate is a first projection, and an orthographic projection of the second film layer on the first substrate is a second projection, so that:

the first projection (such as that of the first film layer 12a) may be located in a middle region of the second projection (such as that of the second film layer 12c), that is, the edge of the first projection and the edge of the second projection do not coincide, as shown in FIG. 7 illustrating the schematic diagram of relative positions of various film layers in the first transmission pad corresponding to FIG. 6; at this time, the edges of the various film layers, such as the edges denoted by the dotted line circle k3 and the dotted line circle k4 in FIG. 6, form the step-like climbing design in a direction F1 and a direction F2 shown in FIG. 7.

Thereby, when the conductive component is the conductive adhesive, the conductive adhesive may be conveniently squeezed into the gap between the first transmission pad and the second transmission pad. That is, this design facilitates the operation in addition to realizing the electrical connection between the first transmission pad and the second transmission pad.

Figure 8:
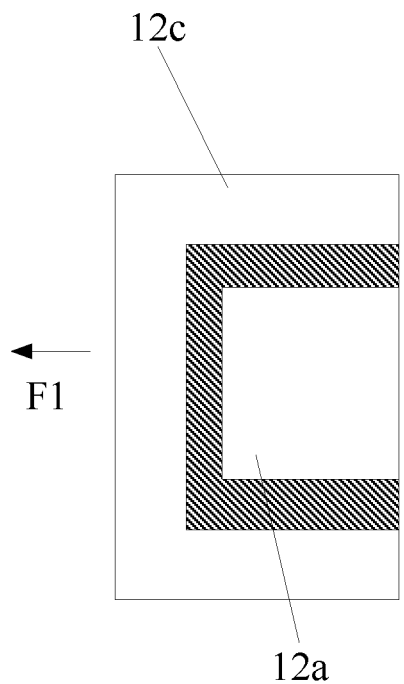
FIG. 8 is a schematic diagram of relative positions of various film layers in the first transmission pad corresponding to FIG. 2.

Of course, the first projection (such as that of the first film layer 12a) may also be located at the edge of the second projection (such as that of the second film layer 12c), that is, the edge at a side of the first projection and the edge at a side of the second projection coincide, as shown in FIG. 8 illustrating the schematic diagram of relative positions of various film layers in the first transmission pad 12 corresponding to FIG. 2; and at this time, the edges of the various film layers form a step-like climbing design only in the direction F1 shown in FIG. 8. It should be noted that the coinciding edge of the first projection and the second projection, such as the edge denoted by the dotted line circle k1 in FIG. 2, needs to be disposed close to the sealant to facilitate the squeezing of the conductive adhesive when the fully-opened opening is disposed facing away from the sealant.

Thereby, when the conductive component is the conductive adhesive, the conductive adhesive may still be conveniently squeezed into the gap between the first transmission pad and the second transmission pad. As such this design also facilitates the operation in addition to realizing the electrical connection between the first transmission pad and the second transmission pad. Meanwhile, the design flexibility may also be improved to meet the requirements of various application scenarios.

It is noted that, for the aforementioned step-like climbing design formed by the edges of the various film layers, it is only illustrated by taking the various film layers included in the first transmission pad 12 as an example, but in an actual manufacturing process, the structures of the various film layers in the first transmission pad 12 and the second transmission pad 22 may be set to be the same to form openings with relatively large sizes, as shown in FIG. 6, facilitating the squeezing of the conductive adhesive and facilitating the manufacturing of the conductive component 40, which is not limited herein.

In an actual situation, when the conductive component is the conductive adhesive and the conductive adhesive is squeezed into the gap between the first transmission pad and the second transmission pad, there is a risk that the conductive adhesive flows to the adjacent first transmission pad to cause short circuit due to the contact of the conductive adhesives between two adjacent first transmission pads, which may lead to disorder of signal transmission and affect the performance of the display panel.

Therefore, in order to solve this problem, in some embodiments of the present disclosure, the display panel may further include: spacing components located between the first substrate and the second substrate.

A plurality of first transmission pads and second transmission pads are provided and are in one-to-one correspondence to each other, and at least one spacing component is arranged between two adjacent first transmission pads.

Figure 9:
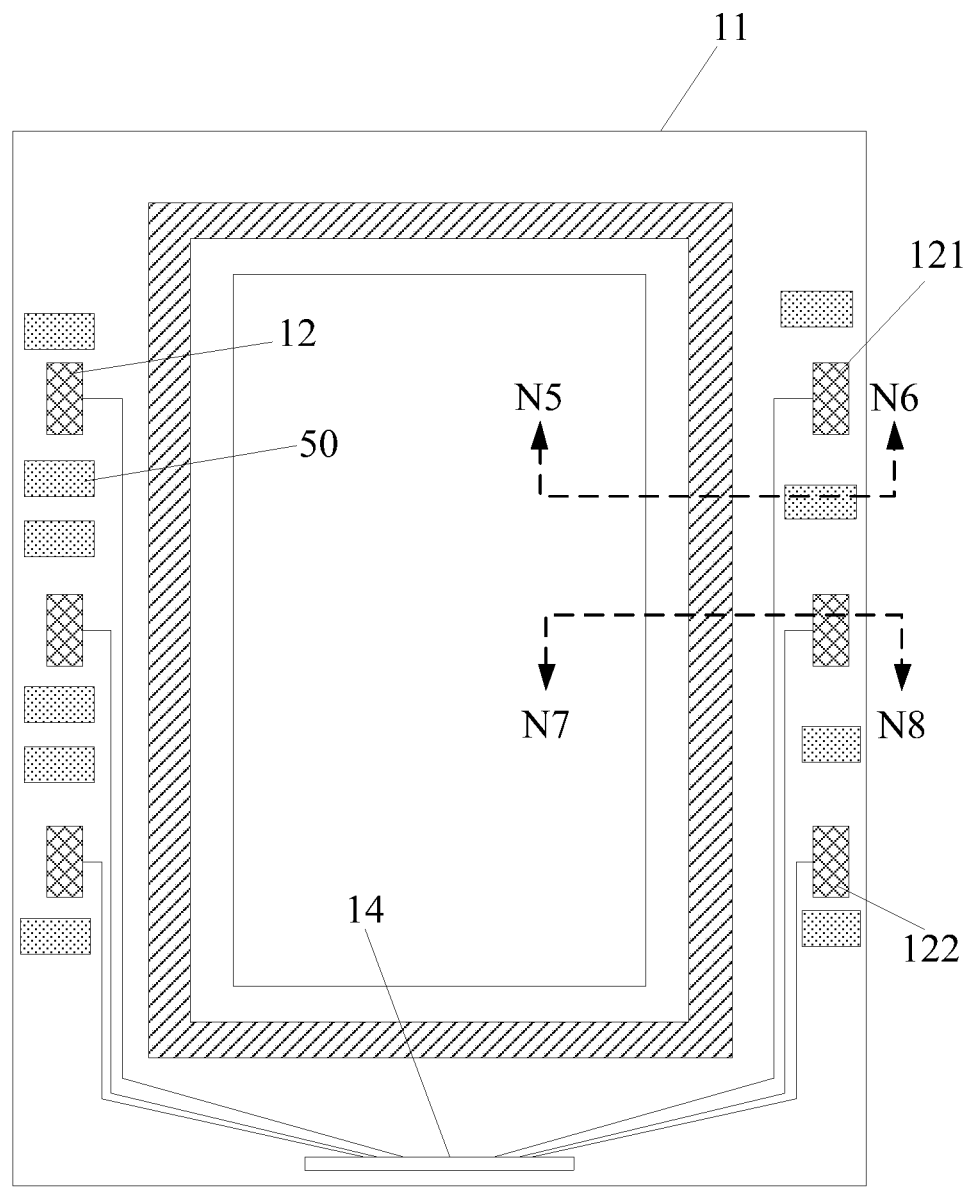
FIG. 9 is a schematic diagram of various structures in the first substrate provided in some embodiments of the present disclosure.

In one embodiment, in order to facilitate the illustration of the spacing components, the schematic diagram of various structures in the first substrate 1 shown in FIG. 9 is taken as an example herein, and the second transmission pads are not shown in this figure. One spacing component 50 may be disposed between two adjacent first transmission pads 12, or two spacing components 50 may also be disposed between two adjacent first transmission pads 12, or more spacing components 50 may also be disposed between two adjacent first transmission pads 12, which is not limited herein.

In this way, through the arrangement of the spacing components 50, the conductive adhesives may be prevented from flowing towards the adjacent first transmission pads 12, avoiding a short circuit caused by the conductive adhesive between two adjacent first transmission pads 12 and improving the reliability of the display panel.

Furthermore, in FIG. 9, each first transmission pad 12 located on the right side of the display area is taken as an example. The first transmission pad 12 closest to a driver chip 14 is marked as 122, and the first transmission pad 12 farthest from the driver chip 14 is marked as 121. The spacing component 50 is also disposed at a side, away from the driver chip 14, of the first transmission pad 121, and the spacing component 50 is also disposed at a side, close to the driver chip 14, of the first transmission pad 122.

That is, the spacing component 50 is disposed at a side of each of the first transmission pads (such as the first transmission pads 121 and 122 in FIG. 9), arranged closest to the sides, namely away from the middle position, in the various first transmission pads 12 located on the same side of the display area.

In this way, through the arrangement of the spacing components 50, the first transmission pads 12, disposed closest to the sides, in the various first transmission pads 12 located on the same side of the display area may be spaced from other surrounding conductive structures to avoid the problem of short circuit caused by the conductive adhesives flowing towards the other surrounding conductive structures and then avoid influences to other conductive structures, improving the reliability of the display panel.

In some embodiments of the present disclosure, the spacing components may be located on a side, facing the second substrate, of the first substrate.

At this time, the distance from the surface of the side, facing away from the first substrate, of the spacing component to the first substrate in a direction perpendicular to the surface of the first substrate is a first distance, and the first distance is greater than the height of the first transmission pad.

Figure 10:
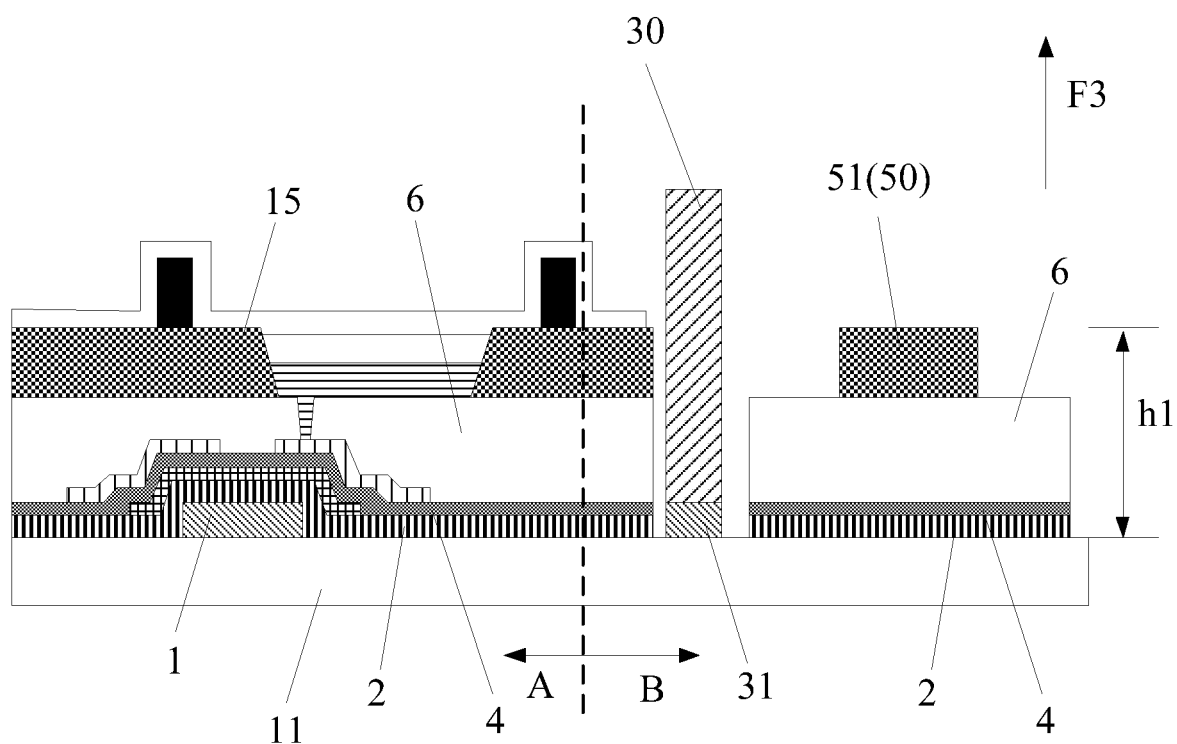
FIG. 10 is a cross-sectional view taken along the line N5-N6 indicated in FIG. 9.
Figure 11:
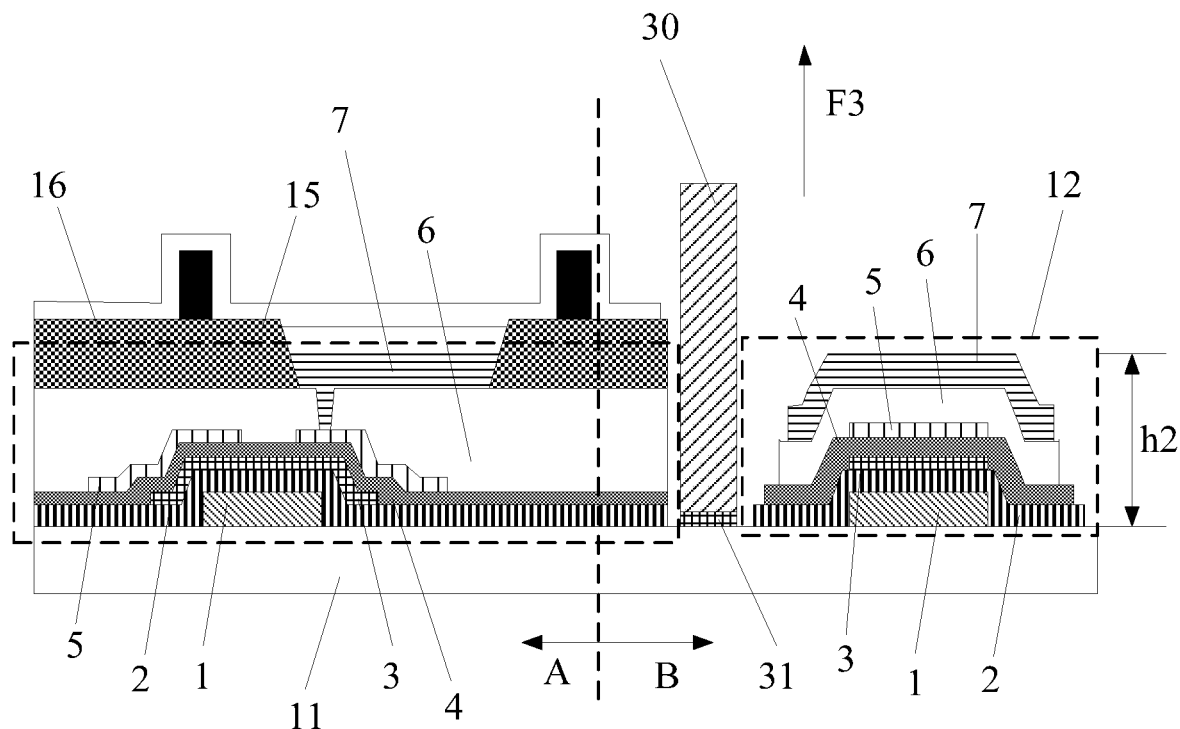
FIG. 11 is a cross-sectional view taken along the line N7-N8 indicated in FIG. 9.

In one embodiment, referring to FIG. 10 illustrating a cross-sectional view taken along the line N5-N6 indicated in FIG. 9, and FIG. 11 illustrating a cross-sectional view taken along the line N7-N8 indicated in FIG. 9, the direction perpendicular to the surface of the first substrate 11 may be denoted by F3, and the first distance from the surface of the side, facing away from the first substrate 11, of the spacing component 50 to the first substrate 11 is denoted by h1, and the height of the first transmission pad 12 is denoted by h2, where h1 is greater than h2.

It is noted that film layers are disposed between the spacing components 50 and the first substrate in the region where the spacing components 50 are located. These film layers are all made of non-metal materials, as shown in FIG. 10, and have structures the same as those of the various film layers made of non-metal materials in the display area A.

In one embodiment, the illustration shown in FIG. 10 is taken as an example. In the display area A, the various film layers formed on the surface of the first substrate 11 and made of the non-metal materials sequentially include: a gate insulating layer 2, an interlayer insulating layer 4 and a planarizing layer 6. Correspondingly, in the region where the spacing components 50 are located, the various film layers located between the spacing components 50 and the first substrate in the direction F3 sequentially include: a gate insulating layer 2, an interlayer insulating layer 4 and a planarizing layer 6. That is, for the display area A and the region where the spacing components 50 are located, the gate insulating layers 2 are manufactured by adopting the same process, the interlayer insulating layers 4 are manufactured by the same process, and the planarizing layers 6 are also manufactured by the same process. Therefore, the manufacturing process is simplified, the manufacturing difficulty is lowered, and meanwhile, the spacing components 50 may be ensured to achieve a relatively good barrier effect.

In this way, the spacing components may effectively prevent the conductive adhesives from flowing towards the adjacent first transmission pads 12, so that the spacing components have the relatively good barrier effect to effectively avoid the short circuit between two adjacent first transmission pads 12, and furthermore, the reliability of the display panel may be greatly improved.

Of course, the first distance h1 may be set according to a distance between the first substrate and the second substrate, that is, the first distance h1 needs to be less than or equal to the distance between the first substrate and the second substrate. In this way, not only can a very good effect on supporting the first substrate and the second substrate be achieved, but also the thickness of the display panel is enabled to be consistent, so that the problem that a partial region of the display panel is excessively thick due to the too large first distance h1 is avoided.

In some embodiments of the present disclosure, the spacing components may be manufactured by adopting the following methods.

Method 1:

In some embodiments, when the display panel includes pixel defining structures located in the display area, the spacing component may include a first spacing structure, and the material of the first spacing structure is the same as that of the pixel defining structures.

The pixel defining structure of the display area may define an open area of a pixel. An anode and an emitting layer are disposed in the open area. A cathode may be disposed in entire surface on the first substrate. The cathode and the anode may respectively input electrons and holes to the emitting layer. The electrons and the holes are combined in the emitting layer to generate energy which may excite a luminescence material to emit light, realizing a display function of the display panel. Therefore, the display panel in the embodiments of the present disclosure may be an electroluminescence display panel.

In one embodiment, as shown in FIG. 10, the pixel defining structure 15 is indicated by a region filled with grids in the region indicated by A in the figure, and the first spacing structure 51 in the non-display area is also indicated by the region filled with grids, which indicates that the pixel defining structure 15 and the first spacing structure 51 are made of the same material.

In this way, not only can the conductive adhesive be prevented by the spacing component from flowing towards the adjacent first transmission pad to improve the reliability of the display panel, but also the pixel defining structure and the spacing component can be manufactured by adopting the same manufacturing process, so that the manufacturing process of the display panel is simplified, and the manufacturing difficulty of the display panel is lowered.

Method 2:

In some embodiments, when the display panel further includes spacers located in the display area, the spacing component may include a second spacing structure, and the material of the spacers is the same as that of the second spacing structure, which is not illustrated in the figure.

The spacers in the display area may achieve a supporting effect on the second substrate, so that not only can the box thickness of the display panel be ensured to be uniform, but also the structures in the display panel can be protected to avoid damaging the structures inside the display panel when the display panel is pressed, improving the reliability of the display panel.

Furthermore, since the materials for manufacturing the spacers and the second spacing structures are the same, the spacers and the second spacing structures may be simultaneously manufactured by adopting the same manufacturing process to simplify the manufacturing process of the display panel and lowering the manufacturing difficulty of the display panel.

Method 3:

In some embodiments, when the display panel includes spacers located in the display area, the spacing component may further include: a second spacing structure stacked with the first spacing structure, and materials for manufacturing the spacers and the second spacing structures are the same.

Figure 12:
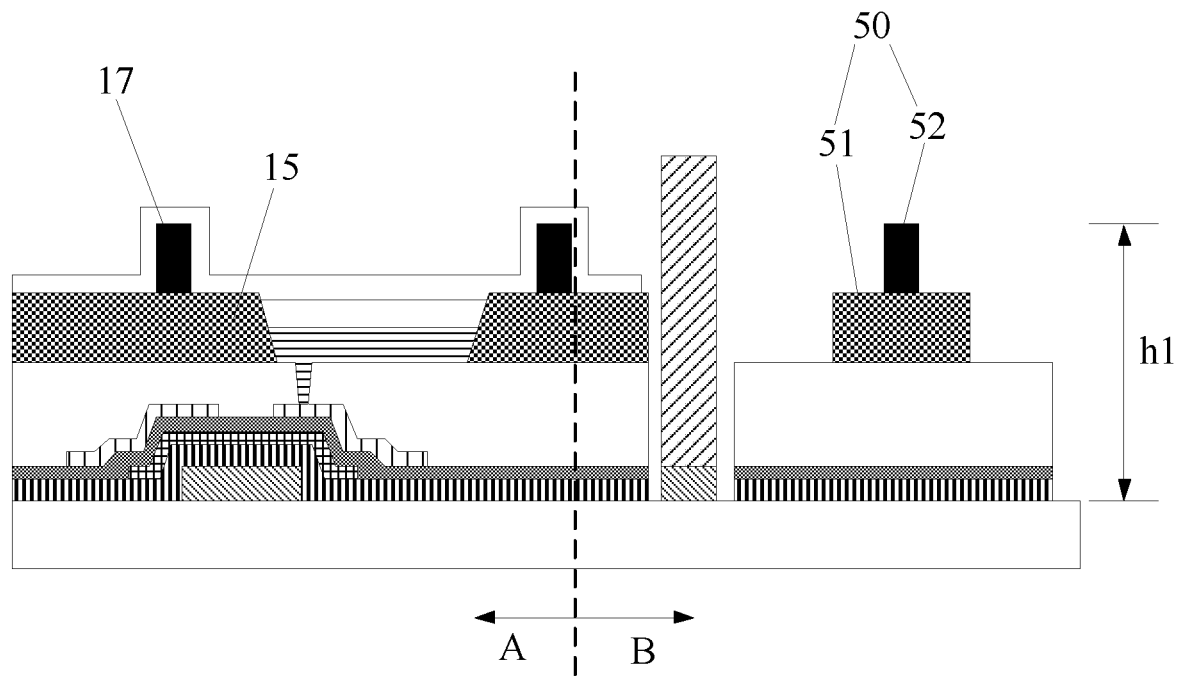
FIG. 12 is another cross-sectional view taken along the line N5-N6 indicated in FIG. 9.

That is, the method 3 is a method combined with the method 1 and the method 2. The spacing component includes both the first spacing structure and the second spacing structure. As shown in FIG. 12 illustrating another cross-sectional view taken along the line N5-N6 indicated in FIG. 9, the stacking order of the first spacing structure 51 and the second spacing structure 52 is the same as that of the pixel defining structure 15 and the spacer 17. That is, the first spacing structure 51 and the pixel defining structure 15 are manufactured by adopting the same manufacturing process, and the second spacing structure 52 and the spacer 17 are manufactured by adopting the same manufacturing process.

In this way, the spacing component may have a relatively large height, i.e., the value of the first distance h1 is relatively large, so that the spacing components may have an excellent prevention effect for avoiding the conductive adhesives from flowing towards the adjacent first transmission pads and effectively decreasing the occurrence probability of the short circuit between two adjacent first transmission pads, greatly improving the reliability of the display panel.

In the embodiments of the present disclosure, the display panel further includes: pixel defining structures located on the side, facing the second substrate, of the first substrate and first film layer structures located between the pixel defining structures and the first substrate. The pixel defining structures and the first film layer structures may be both located in the display area.

The first film layer structures include N film layers, and the first transmission pads include N film layers. In a direction from the surface of the first substrate to the surface of the second substrate, the ith film layers in the first transmission pads and the ith film layers in the first film layer structures are made of the same material and are disposed on the same layer.

Here N is greater than 1, and i is greater than 0.

In one embodiment, as shown in FIG. 11, the first film layer structure 16 includes seven film layers, and the first transmission pad 12 also includes seven film layers. The direction from the surface of the first substrate 11 to the surface of the second substrate is a direction F3.

Along the direction indicated by F3, the first film layer structure 16 includes the seven film layers as follows: a gate 1 of a transistor, a gate insulating layer 2, an active layer 3 of the transistor, an interlayer insulating layer 4, a source 5 of the transistor, a planarizing layer 6 and an anode 7.

Similarly, along the direction indicated by F3, the first transmission pad 12 also includes the seven film layers as follows: a second film layer 1, a middle film layer 2, a middle film layer 3, a middle film layer 4, a middle film layer 5, a middle film layer 6 and a first film layer 7.

Furthermore, the film layers marked by the same numerals in FIG. 11 are manufactured by adopting the same manufacturing process, that is, the film layers marked by the same numerals are made of the same material and are disposed on the same layer. In one embodiment, the film layer marked by 3 in the first film layer structure 16 is a third film layer in the direction F3, the film layer marked by 3 in the first transmission pad 12 is also a third film layer in the direction F3, and the two film layers are made of the same material and are disposed in the same layer.

In this way, the first film layer structure 16 and the first transmission pad 12 may be manufactured at the same time, simplifying the manufacturing process of the display panel, lowering the manufacturing difficulty of the display panel and improving the manufacturing efficiency of the display panel.

Of course, a bottom gate type transistor is illustrated as an example in FIG. 11, but this does not mean that the transistor is only of the bottom gate type and may also be of a top gate type (not illustrated in the figure). At this time, the first film layer structure and the first transmission pad still include the same number of film layers. Furthermore, in the direction from the surface of the first substrate to the surface of the second substrate, the ith film layer in the first transmission pad and the ith film layer in the first film layer structure are still made of the same material and are disposed in the same layer.

It is noted that in an actual manufacturing process, the anode needs to be manufactured after the planarizing layer is manufactured, and then, the pixel defining structure is manufactured after the anode is manufactured. Therefore, in the above embodiments, the material of the first film layer (such as the film layer marked by 7 in FIG. 11) in the first transmission pad is the same as that of the anode (such as the film layer marked by 7 in FIG. 11) in the first film layer structure.

Meanwhile, since the first transmission pad needs to be electrically connected with the conductive component, when the first film layer in the first transmission pad and the anode are made of the same material, the first transmission pad may be ensured to be electrically connected with the conductive component, lowering the manufacturing difficulty of the display panel and improving the manufacturing efficiency of the display panel.

Furthermore, in spite of the number of the film layers included in the second transmission pad, the third film layer is made of a conductive material. At this time, when the conductive component is in direct contact with the third film layer, the electrical connection between the conductive component and the second transmission pad may be realized.

In some embodiments of the present disclosure, the thickness of the first film layer structure is a first thickness, the thickness of the first transmission pad is a second thickness, and the first thickness is equal to the second thickness.

That is, the first film layer structure and the first transmission pad may be manufactured by adopting the same process. Taking the gate in the first film layer structure and the second film layer in the first transmission pad as an example. During the manufacturing process, a layer of metal may be firstly manufactured on the surface of the first substrate, and then, a pattern is made through a composition process, to form the gate and the second film layer. Therefore, the first film layer structure and the first transmission pad obtained through adopting the above method may be the same in thickness.

In this way, the manufacturing difficulty of the first transmission pad may be simplified, the thickness of the first transmission pad may be also effectively controlled, and further, the manufacturing of the spacing component is facilitated, so that the reliability of the display panel is improved, and the manufacturing difficulty of the display panel is lowered.

In some embodiments of the present disclosure, the display panel may further include: encapsulating adhesives located between the first substrate and the second substrate. The encapsulating adhesives are located on sides, away from the sealant, of the various first transmission pads.

It is noted that, in some embodiments, when the display panel includes a driver chip (such as 14 shown in FIG. 1), the driver chip 14 needs to be bound with a flexible circuit board, to allow a driver signal from the outside be input into the driver chip 14 through the flexible circuit board. If the region where the driver chip 14 is located is marked as a first region (denoted by B1 in FIG. 1), the encapsulating adhesives 60 may be set as follows.

In some embodiments, as shown in FIG. 1, the encapsulating adhesives 60 is set in non-display areas marked by B2, B3 and B4, and is located at the sides, away from the sealant 30, of the various first transmission pads 12.

That is, the display panel may be re-encapsulated through the encapsulating adhesives 60, so that the encapsulating adhesives 60 may protect circuits (such as, but not limited to an anti-static circuit) in the non-display areas and prevent the structures such as the first transmission pads and the second transmission pads from being eroded by water and oxygen, and then, the structures in the non-display areas may work normally and effectively to ensure that the display panel may display images normally.

Furthermore, the arrangement of the encapsulating adhesives 60 may also be favorable for enhancing the mechanical strength of the display panel and reducing the probability of damage to the display panel, improving the reliability of the display panel.

In some embodiments, when the display panel includes an array substrate and a touch substrate disposed oppositely, in the embodiment of the present disclosure, the array substrate includes the first substrate, and the touch substrate includes the second substrate.

The second wires are touch signal lines.

The display panel further includes: a driver chip located on the side, facing the second substrate, of the first substrate, and the first wires are electrically connected with the driver chip.

In this way, a touch signal on the touch substrate may be transmitted to the first wires in the array substrate through the first transmission pads and the second transmission pads, and then transmitted to the driver chip through the first wires, realizing the transmission of the touch signal between the array substrate and the touch substrate to facilitate realizing a touch function.

Furthermore, since the display panel only has one driver chip, i.e., since the touch substrate and the array substrate share the same driver chip, the structure of the display panel may be simplified, and the manufacturing cost of the display panel may be reduced.

Figure 13:
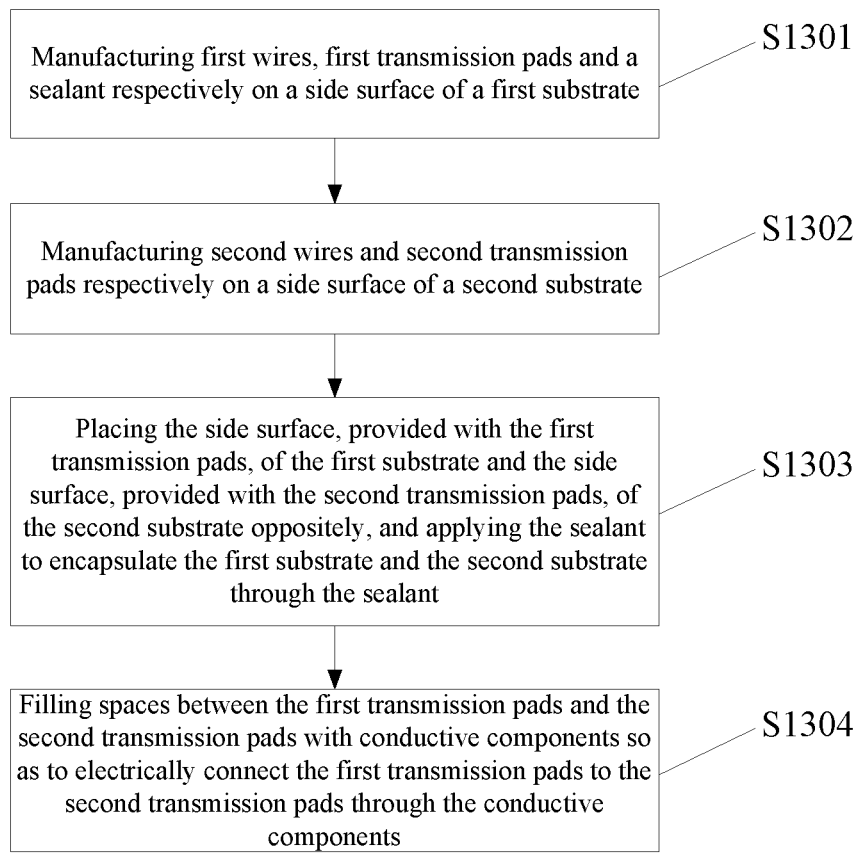
FIG. 13 is a flow schematic diagram of a manufacturing method of the display panel provided in some embodiments of the present disclosure.

Based on the same inventive concept, an embodiment of the present disclosure provides a manufacturing method of a display panel, as shown in FIG. 13 illustrating a flow diagram of the manufacturing method of the display panel, including:

S1301: manufacturing first wires, first transmission pads and a sealant respectively on a side surface of a first substrate.

Here the first transmission pads are electrically connected with the first wires.

S1302: manufacturing respectively second wires and second transmission pads on a side surface of a second substrate.

Here the second transmission pads are electrically connected with the second wires.

S1303: placing the side surface, provided with the first transmission pads, of the first substrate and the side surface, provided with the second transmission pads, of the second substrate oppositely, and applying the sealant to encapsulate the first substrate and the second substrate through the sealant.

S1304: filling spaces between the first transmission pads and the second transmission pads with conductive components to electrically connect the first transmission pads to the second transmission pads through the conductive components.

The display panel includes a display area and a non-display area surrounding the display area; the sealant, the first transmission pads and the second transmission pads are all located in the non-display area; the first transmission pads and the second transmission pads are both located on the side, away from the display area, of the sealant; orthographic projections of the first transmission pads and the second transmission pads on the first substrate have an overlapping area. The first transmission pads include film layers, and in the same first transmission pad, the film layer farthest from the surface of the first substrate is a first film layer, the film layer closest to the surface of the first substrate is a second film layer, and the area of the first film layer is less than that of the second film layer.

In an actual situation, generally, before the sealant is applied, an encapsulating metal layer 31 is manufactured on the position for the sealant, i.e., orthographic projections of the encapsulating metal layer 31 and the sealant on the first substrate coincide. When the sealant is applied, laser is used to irradiate the sealant and the encapsulating metal layer 31, where the energy of the laser may be reflected into the sealant due to the reflection of the encapsulating metal layer 31 to make the energy of the laser fully act on the sealant to reduce the loss of the laser and to fully solidify the sealant to thus encapsulate the first substrate and the second substrate.

In the embodiments of the present disclosure, the encapsulating metal layer may be manufactured as follows.

The encapsulating metal layer is made of the same material as a gate of a transistor in the display area and disposed on the same layer as the gate, as shown in FIG. 10. That is, the encapsulating metal layer 31 and the gate are manufactured by adopting the same composition process, so that the manufacturing process of the display panel is simplified, and the manufacturing difficulty is lowered.

Or, the encapsulating metal layer 31 and a source/drain of the transistor are made of the same material and are disposed in the same layer, as shown in FIG. 11.

Or, the encapsulating metal layer 31 and signal lines located between the gate and the source of the transistor are made of the same material and are disposed in the same layer, which is not illustrated in the figure.

Or, the encapsulating metal layer and other electrode structures are made of the same material and are disposed in the same layer, which is not illustrated in the figure.

That is, the encapsulating metal layer may be set according to an actual need, so that the requirements of various application scenarios are met, and the design flexibility is improved.

In some embodiments of the present disclosure, the manufacturing method further includes the following step.

Manufacturing spacing components on the side surface, provided with the first transmission pads, of the first substrate.

A plurality of first transmission pads and second transmission pads are provided and are in one-to-one correspondence to each other, and at least one spacing component is arranged between two adjacent first transmission pads.

Figure 14:
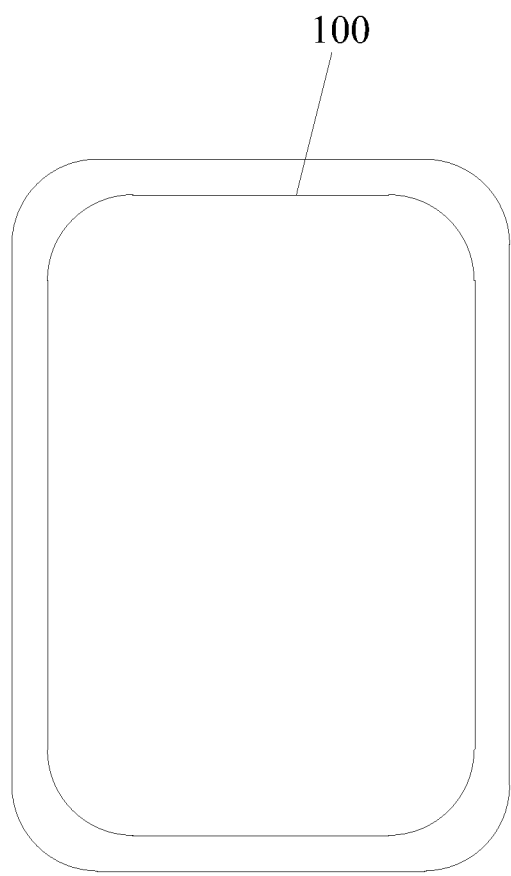
FIG. 14 is a schematic structural diagram of a display device provided in some embodiments of the present disclosure.

Based on the same inventive concept, an embodiment of the present disclosure provides a display device, as shown in FIG. 14 illustrating a schematic structural diagram of the display device, including: the aforementioned display panel 100 provided by the embodiments of the present disclosure.

In some embodiments, the display device may be: any product or component having a display function, such as a mobile phone (as shown in FIG. 14), a tablet computer, a television, a display, a notebook computer, a digital photo frame and a navigator. The implementation of the display device may refer to the embodiment of the aforementioned display panel, and repeated descriptions are omitted.

What is claimed is:

1. A display panel, comprising a display area and a non-display area surrounding the display area, and further comprising:
    a first substrate and a second substrate, disposed oppositely;
    a sealant, disposed between the first substrate and the second substrate and located in the non-display area;
    first transmission pads and first wires, disposed on a side, facing the second substrate, of the first substrate, wherein the first transmission pads are correspondingly electrically connected with the first wires;
    second transmission pads and second wires, disposed on a side of the second substrate facing the first substrate, wherein the second transmission pads are correspondingly electrically connected with the second wires, the first transmission pads and the second transmission pads are both located at a side of the sealant away from the display area, and orthographic projections of the first transmission pads and the second transmission pads on the first substrate have an overlapping field; and
    conductive components, disposed between the first transmission pads and the second transmission pads and electrically connected to the first transmission pads and the second transmission pads, respectively,
    wherein the first transmission pads comprise a plurality of film layers, in a same first transmission pads, a first film layer is a film layer farthest from a surface of the first substrate, a second film layer is a film layer closest to the surface of the first substrate, and an area of the first film layer is less than that of the second film layer.

2. The display panel according to claim 1, wherein an area of each film layer of the same first transmission pads is in negative correlation with a distance from the each film layer to the surface of the first substrate.

3. The display panel according to claim 1, wherein the second transmission pads comprise a plurality of film layers;
    for various film layers comprised in a same second transmission pads: a third film layer is a film layer farthest from a surface of the second substrate, a fourth film layer is a film layer closest to the surface of the second substrate, and an area of the third film layer is less than that of the fourth film layer; and
    orthographic projections of the third film layer and the first film layer on the first substrate have an overlapping field.

4. The display panel according to claim 3, wherein an area of each film layer of the same second transmission pads is in negative correlation with a distance from the each film layer to the surface of the second substrate.

5. The display panel according to claim 1, wherein orthographic projections of the first transmission pads and the second transmission pads on the first substrate coincide.

6. The display panel according to claim 1, wherein the display panel further comprises: a plurality of spacing components located between the first substrate and the second substrate;
a plurality of first transmission pads and a plurality of second transmission pads are provided and are in one-to-one correspondence to each other, and at least one of the plurality of spacing components is arranged between two adjacent first transmission pads.

7. The display panel according to claim 6, wherein the plurality of spacing components are disposed on a side of the first substrate facing the second substrate;
a distance from a surface of a side of one of the plurality of spacing components deviated from the first substrate to the first substrate in a direction perpendicular to the surface of the first substrate is a first distance greater than a height of the first transmission pads.

8. The display panel according to claim 6, wherein the display panel comprises pixel defining structures located in the display area;
the plurality of spacing components comprise first spacing structures, and the first spacing structures and the pixel defining structures are made of a same material.

9. The display panel according to claim 8, wherein the display panel further comprises spacers located in the display area;
the plurality of spacing components further comprise: second spacing structures stacked with the first spacing structures, and the spacers and the second spacing structures are made of a same material.

10. The display panel according to claim 1, wherein gaps exist between the first transmission pads and the second transmission pads.

11. The display panel according to claim 10, wherein the conductive components are conductive adhesives comprising conductive spherical particles, and diameters of the conductive spherical particles are less than or equal to a minimum distance from the first transmission pads to the second transmission pads.

12. The display panel according to claim 11, wherein the diameters of the conductive spherical particles are 2.5 µm to 3.5 µm.

13. The display panel according to claim 11, wherein the conductive spherical particles are conductive gold ball particles.

14. The display panel according to claim 1, wherein the display panel further comprises: pixel defining structures disposed on a side, facing the second substrate, of the first substrate and first film layer structures disposed between the pixel defining structures and the first substrate, and the pixel defining structures and the first film layer structures are both located in the display area;
the first film layer structures comprise N film layers, the first transmission pads comprise N film layers, and in a direction from the first substrate to the second substrate, an ith film layers in the first transmission pads and the ith film layers in the first film layer structures are made of a same material and are disposed in a same layer; and
N is greater than 1, and i is greater than 0.

15. The display panel according to claim 14, wherein a thickness of the first film layer structures is a first thickness, a thickness of the first transmission pads is a second thickness, and the first thickness is equal to the second thickness.

16. The display panel according to claim 1, wherein the display panel further comprises: encapsulating adhesives located between the first substrate and the second substrate; the encapsulating adhesives are located on a side of the first transmission pads away from the sealant.

17. The display panel according to claim 1, wherein the display panel comprises an array substrate and a touch substrate disposed oppositely;
the array substrate comprises the first substrate, and the touch substrate comprises the second substrate;
the second wires are touch signal lines;
the display panel further comprises: a driver chip located on a side of the first substrate facing the second substrate, and the first wires are electrically connected with the driver chip.

18. A display device, comprising:
a display panel, comprising:
a display area and a non-display area surrounding the display area, and further comprising:
a first substrate and a second substrate, disposed oppositely;
a sealant, disposed between the first substrate and the second substrate and located in the non-display area;
first transmission pads and first wires, disposed on a side, facing the second substrate, of the first substrate, wherein the first transmission pads are correspondingly electrically connected with the first wires;
second transmission pads and second wires, disposed on a side of the second substrate facing the first substrate, wherein the second transmission pads are correspondingly electrically connected with the second wires, the first transmission pads and the second transmission pads are both located at a side of the sealant away from the display area, and orthographic projections of the first transmission pads and the second transmission pads on the first substrate have an overlapping field; and
conductive components, disposed between the first transmission pads and the second transmission pads and electrically connected to the first transmission pads and the second transmission pads, respectively,
wherein the first transmission pads comprise a plurality of film layers, in a same first transmission pads, a first film layer is a film layer farthest from a surface of the first substrate, a second film layer is a film layer closest to the surface of the first substrate, and an area of the first film layer is less than that of the second film layer.

19. A manufacturing method of a display panel, comprising:
manufacturing first wires, first transmission pads and a sealant respectively on a side surface of a first substrate, wherein the first transmission pads are electrically connected with the first wires;
manufacturing second wires and second transmission pads respectively on a side surface of a second substrate, wherein the second transmission pads are electrically connected with the second wires;
placing a side surface, provided with the first transmission pads, of the first substrate and a side surface, provided with the second transmission pads, of the second substrate oppositely, and applying the sealant to encapsulate the first substrate and the second substrate through the sealant;
filling spaces between the first transmission pads and the second transmission pads with conductive components to electrically connect the first transmission pads to the second transmission pads through the conductive components, wherein the display panel comprises a display area and a non-display area surrounding the display area; the sealant, the first transmission pads and the second transmission pads are all located in the non-display area; the first transmission pads and the second transmission pads are both located at a side, away from the display area, of the sealant; orthographic projections of the first transmission pads and the second transmission pads on the first substrate have an overlapping field; and the first transmission pads comprise a plurality of film layers, in a same first transmission pads, a first film layer is a film layer farthest from a surface of the first substrate, a second film layer is a film layer closest to the surface of the first substrate, and an area of the first film layer is less than that of the second film layer.

20. The manufacturing method according to claim 19, further comprising:

manufacturing spacing components on a side surface, provided with the first transmission pads, of the first substrate, wherein a plurality of first transmission pads and a plurality of second transmission pads are provided and are in one-to-one correspondence to each other, and at least one of the spacing components is arranged between two adjacent first transmission pads.

\* \* \* \* \*